(12) United States Patent
Abbott et al.

(10) Patent No.: US 7,703,053 B2
(45) Date of Patent: Apr. 20, 2010

(54) REGIONAL PATTERN DENSITY DETERMINATION METHOD AND SYSTEM

(75) Inventors: Geoffrey K. Abbott, South Burlington, VT (US); Howard S. Landis, Underhill, VT (US); David P. Parker, Maricopa, AZ (US)

(73) Assignee: International Business Machines Corporation, Armonk, NY (US)

( * ) Notice: Subject to any disclaimer, the term of this patent is extended or adjusted under 35 U.S.C. 154(b) by 628 days.

(21) Appl. No.: 11/566,884

(22) Filed: Dec. 5, 2006

(65) Prior Publication Data

US 2008/0134111 A1  Jun. 5, 2008

(51) Int. Cl.
 *G06F 17/50* (2006.01)
(52) U.S. Cl. ......................................................... 716/4
(58) Field of Classification Search ....................... 716/4
 See application file for complete search history.

(56) References Cited

U.S. PATENT DOCUMENTS 5,875,117 A * 2/1999 Jones et al. ................... 716/14
6,671,859 B1 * 12/2003 Naylor et al. ................... 716/2
2004/0230931 A1 * 11/2004 Barbee et al. .................. 716/10
2007/0143724 A1 * 6/2007 Alpert et al. ................... 716/10
2008/0216040 A1 * 9/2008 Furnish et al. ................. 716/10

* cited by examiner

*Primary Examiner*—Vuthe Siek
*Assistant Examiner*—Patrick Sandoval
(74) *Attorney, Agent, or Firm*—Ryan K. Simmons; Hoffman Warnick LLC

(57) ABSTRACT

A method and system of determining a localized measure of regional pattern density in a fabrication process of a chip are disclosed. In one embodiment, the method includes determining pattern density values for each cell of a plurality of cells of interest; averaging the pattern density values for each cell within a first selected region about a target cell to determine the localized measure of regional pattern density for the target cell; storing the localized measure of regional pattern density for the target cell; and repeating the averaging and the storing for each of the plurality of cells. The simplification of data allows for a localized measure of regional pattern density determination in much less time than conventional techniques.

6 Claims, 3 Drawing Sheets

REGIONAL PATTERN DENSITY DETERMINATION METHOD AND SYSTEM

BACKGROUND OF THE INVENTION

1. Technical Field

The invention relates generally to semiconductor device design, and more particularly, to a method and system of determining a localized measure of regional pattern density in a fabrication process of an integrated circuit (IC) chip.

2. Background Art

In the IC chip fabrication industry, long-range density checks for semiconductor designs are conducted during the fabrication process. Current techniques for determining density are very resource intensive, and do not allow interactive (near real-time) manipulations. For example, density calculations related to rapid thermal anneal (RTA) or polysilicon critical dimension control (Poly CD Control) for an advanced microprocessor, require density calculations of circuit features over length scales exceeding several millimeters. Performing these calculations with sufficient granularity (e.g., 25-50 micron stepping increments) with conventional tools and methods takes many days. Consequently, remedial changes to the semiconductor design during fabrication are oftentimes impossible.

SUMMARY OF THE INVENTION

A method and system of determining a localized measure of regional pattern density in a fabrication process of a chip are disclosed. In one embodiment, the method includes determining pattern density values for each cell of a plurality of cells of interest; averaging the pattern density values for each cell within a first selected region about and including a target cell to determine the localized measure of regional pattern density for the target cell; storing the localized measure of regional pattern density for the target cell; and repeating the averaging and the storing for each of the plurality of cells. The simplification of data allows for a localized measure of regional pattern density determination in much less time than conventional techniques.

A first aspect of the invention provides a method of determining a localized measure of regional pattern density in a fabrication process of a chip, the method comprising: determining pattern density values for each cell of a plurality of cells of interest; averaging the pattern density values for each cell within a first selected region about and including a target cell to determine the localized measure of regional pattern density for the target cell; storing the localized measure of regional pattern density for the target cell; and repeating the averaging and the storing for each of the plurality of cells.

A second aspect of the invention provides a system for determining a localized measure of regional pattern density in a fabrication process of a chip, the system comprising: a density determinator for determining pattern density values for each cell of a plurality of cells of interest; an averager for averaging the pattern density values for each cell within a first selected region about and including a target cell to determine the localized measure of regional pattern density for the target cell; a storer for storing the localized measure of regional pattern density for the target cell; and a repeater for repeating the averaging and the storing for each of the plurality of cells.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
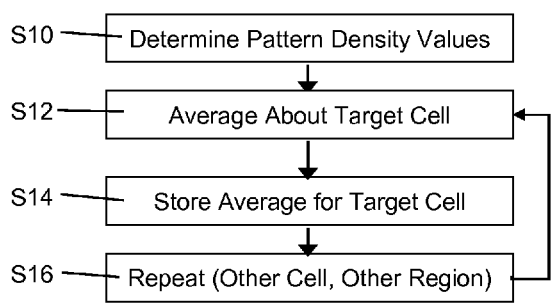
FIG. 1 shows a flow diagram of one embodiment of a method.
Figure 2:
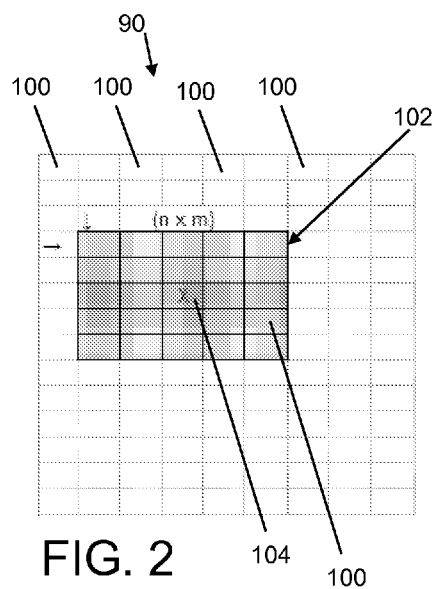
FIG. 2 shows a schematic diagram of part of an IC chip including a highlighted selected region about a target cell.
Figure 3:
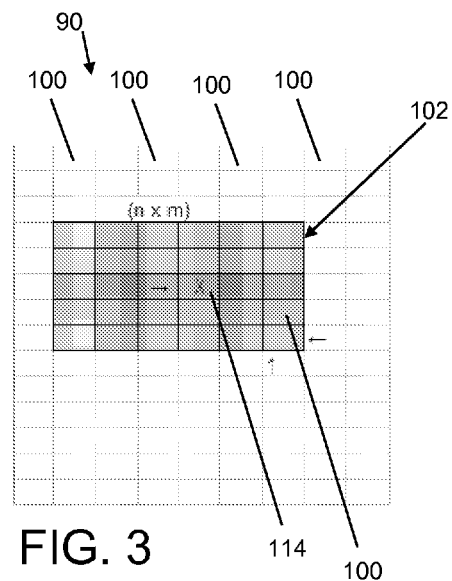
FIG. 3 shows a schematic diagram of part of an IC chip including a highlighted selected region about another target cell in a sequence.

Referring to FIG. 1, a flow diagram of one embodiment of a method of determining a localized measure of regional pattern density in a fabrication process of an integrated circuit (IC) chip is shown. FIGS. 2 and 3 show one illustrative grid of a chip 90. In this instance, "pattern density" includes the combined density of all diffusion region, gate and polysilicon features within a local region of interest. Pattern density may be defined differently depending on application. Each grid is segmented into a number of cells 100. Each cell represents a smallest level of granularity desired to be evaluated. For example, each cell 100 may be 20 nm by 20 nm. While the invention will be described relative to regional pattern density at an IC chip level, it may also be applied at a wafer level.

Turning to FIGS. 1-3 collectively, at S10, pattern density values are determined for each cell 100 of a plurality of cells of interest. Pattern density values for each cell 100 may be determined using any now known or later developed technique.

At S12, the pattern density values for each cell within a first selected region 102 about a target cell 104 are averaged to determine the localized measure of regional pattern density for target cell 104. As shown in FIGS. 2 and 3, an n×m selected region may be generated. The example shown in FIGS. 2-3 is a 5×5 selected region (FIG. 3 is shifted to right); however, the invention is not limited to any size region. In one embodiment, the averaging may include determining a starting point (e.g., cell bottom left) and traversing selected region 102 surrounding and including target cell 104 (marked with an X in FIGS. 2-3). In one embodiment, S12 may include summing pattern density values for each cell 100 in specified region 102 for target cell 104, then dividing that sum by the total number of cells 100 (i.e., n×m). However, other averaging techniques may be employed.

In an alternative embodiment, the localized measure of pattern density may include a weighted average. A variety of different ways to obtain a weighted average may be employed within the scope of the invention. For example, more weight may be given to cells 100 closer to target cell 104 because they have a greater impact, or the pattern density value of target cell 104 may be given more weight than others. In addition, the original pattern density determination may employ weighted averaging, if desired.

At S14, the localized measure of regional pattern density is stored for target cell 104, e.g., in a database.

At S16, S12 and S14 are repeated for each of the plurality of cells 100, i.e., each cell 100 may become a target cell 104. For example, a next target cell 114 (FIG. 3) is taken in a sequence (e.g., across columns and then rows) until each of the plurality of cells 100 are addressed. S12 and S14 may be carried out for part of, or every, cell 100 in the data set.

Figure 5:
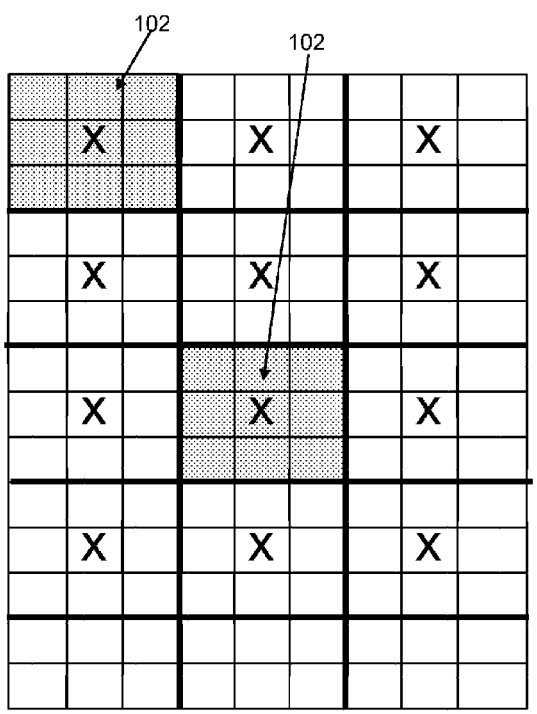
FIG. 5 shows a schematic diagram of part of an IC chip including many selected regions, one of which is highlighted.
Figure 6:
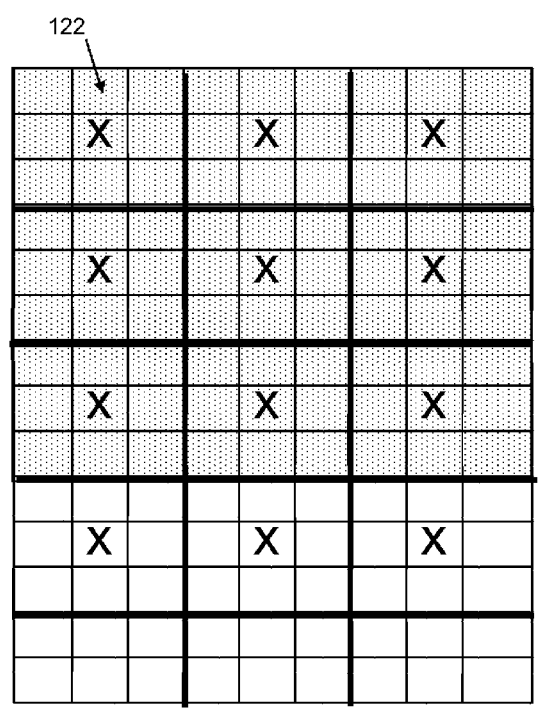
FIG. 6 shows a schematic diagram of part of an IC chip including a highlighted selected region including a plurality of selected regions from FIG. 5.

In addition, S16 may also include repeating S12 and S14 for, as shown in FIG. 6, a second selected region 122 including a plurality of first selected regions 102, as shown in FIG. 5 (only two highlighted). That is, any number of second passes may be employed. In this fashion, the size of the selected region can be enlarged to further reduce computational load, and to further weight the averaging where weighted averaging is used. In the latter case, if the results of a one or two-pass average are saved, the results produce an effect, e.g., where cells closer to the target cell are weighted heavier, that higher weighting will be magnified into the resulting average.

Figure 4:
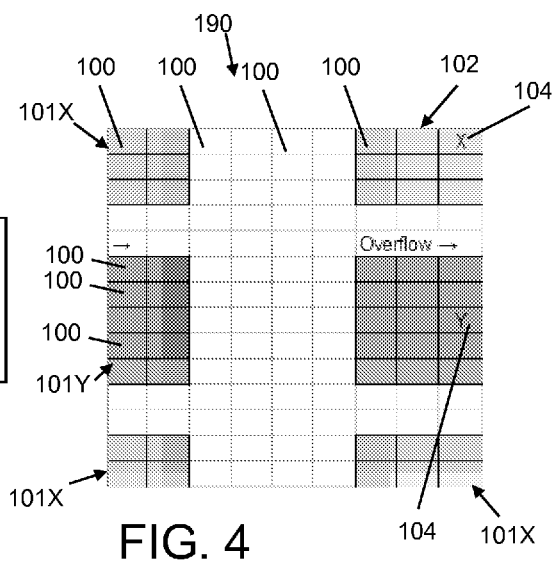
FIG. 4 shows a schematic diagram of an IC chip including highlighted selected regions that extend beyond a border.

Referring to FIG. 4, selected regions 102 about and including target cells 104 that extend beyond a border of the chip present a unique situation. In these cases according to one embodiment, S12 includes averaging using density values from (cells on) a diametrically opposite side(s) of the chip to complete selected region 102. In FIG. 4, consider X and Y as target cells 104 of interest. For simplicity, the grid may represent an entire chip 190. This chip will be stepped on a wafer, so many of these chips will be stacked end to end, and top to bottom. When averaging at the edge of chip 190, e.g., for target cell Y, pattern density values for cells 100 on the other end of the chip will be used for averaging to complete the specified region, i.e., in area 101Y. Target cell Y represents a simpler case where only cells 100 at the left edge of chip 190 (area 101Y) are required. Target cell X represents a more complex case where more edges are used, i.e., in areas 101X.

In operation, the number of calculations becomes quite large (scales as n^2) using the above-described methodology for very large region averaging (n×m). Nevertheless, the above-described methodology is orders of magnitude more efficient than performing n^2 density calculations based on the original data set. As shown in FIGS. 5 and 6 also, where S12 and 14 are repeated, for example, twice (2-pass approach), the number of calculations is drastically reduced. If only one pass is employed, as shown in FIG. 5, a 3×3 grid requires 9 calculations per cell, and a 9×9 grid requires 81 calculations per cell. However, as shown in FIG. 6, a 3×3 grid of 3×3 grids (9×9 grid in 2-pass form) only requires the 9 calculations per cell from the first pass plus the nine calculations per (larger) cell on the second pass. That is a total of 18 calculations per cell versus 81. As region size increases to include hundreds by hundreds of cells, this approach allows a great deal of time savings.

While shown and described herein as methodology, it is understood that the invention further provides various alternative embodiments. For example, in one embodiment, the invention provides a computer-readable/useable medium that includes computer program code to enable a computer infrastructure to perform the method. To this extent, the computer-readable/useable medium includes program code that implements each of the various process of the invention. It is understood that the terms computer-readable medium or computer useable medium comprise one or more of any type of physical embodiment of the program code. In particular, the computer-readable/useable medium can comprise program code embodied on one or more portable storage articles of manufacture (e.g., a compact disc, a magnetic disk, a tape, etc.), on one or more data storage portions of a device (e.g., a fixed disk, a read-only memory, a random access memory, a cache memory, etc.), and/or as a data signal (e.g., a propagated signal) traveling over a network (e.g., during a wired/wireless electronic distribution of the program code).

In another embodiment, the invention provides a business method that performs the process of the invention on a subscription, advertising, and/or fee basis. That is, a service provider, such as a Solution Integrator, could offer to the method. In this case, the service provider can create, maintain, deploy, support, etc., a computer infrastructure that performs the method for one or more customers. In return, the service provider can receive payment from the target organization(s) under a subscription and/or fee agreement and/or the service provider can receive payment from the sale of advertising content to one or more third parties.

In still another embodiment, the invention provides a computer-implemented method. In this case, a computer infrastructure can be provided and one or more systems for performing the process of the invention can be obtained (e.g., created, purchased, used, modified, etc.) and deployed to the computer infrastructure. To this extent, the deployment of a system can comprise one or more of (1) installing program code on a device such as controlling and/or controlled computers, from a computer-readable medium; (2) adding one or more devices to the computer infrastructure; and (3) incorporating and/or modifying one or more existing systems of the computer infrastructure to enable the computer infrastructure to perform processes according to one or more aspects of the invention.

As used herein, it is understood that the terms "program code" and "computer program code" are synonymous and mean any expression, in any language, code or notation, of a set of instructions intended to cause a device having an information processing capability to perform a particular function either directly or after either or both of the following: (a) conversion to another language, code or notation; and/or (b) reproduction in a different material form. To this extent, program code can be embodied as one or more of: an application/software program, component software/a library of functions, an operating system, a basic I/O system/driver for a particular providing and/or I/O device, and the like.

Aspects of the invention can take the form of an entirely software embodiment or an embodiment containing both hardware and software elements. In an embodiment, aspects of the invention are implemented in software, which includes but is not limited to firmware, resident software, microcode, etc. Furthermore, aspects of the invention can take the form of a computer program product accessible from at least one computer-usable or computer-readable medium storing program code for use by or in connection with a computer or any instruction execution system. For the purposes of this description, a computer-usable or computer readable medium can be any tangible apparatus that can contain, store, communicate, propagate, and/or transport the program for use by or in connection with the instruction execution system, apparatus, device, and/or the like.

The medium can be an electronic, magnetic, optical, electromagnetic, infrared, or semiconductor system (or apparatus or device), a propagation medium, and/or the like. Examples of a computer-readable medium include, but are not limited to, a semiconductor or solid state memory, magnetic tape, a removable computer diskette, a random access memory (RAM), a read-only memory (ROM), a rigid magnetic disk and an optical disk. Current examples of optical disks include, but are not limited to, compact disk—read only memory (CD-ROM), compact disk—read/write (CD-R/W) and DVD.

A data processing system suitable for storing and/or executing program code can include at least one processor communicatively coupled, directly or indirectly, to memory element(s) through a system bus. The memory elements can include, but are not limited to, local memory employed during actual execution of the program code, bulk storage, and cache memories that provide temporary storage of at least some program code in order to reduce the number of times code must be retrieved from bulk storage during execution. Input/output or I/O devices (including, but not limited to, keyboards, displays, pointing devices, etc.) can be coupled to the system either directly or through intervening I/O controllers.

Network adapters also may be coupled to the system to enable the data processing system to become coupled to other data processing systems, remote printers, storage devices, and/or the like, through any combination of intervening private or public networks. Illustrative network adapters include, but are not limited to, modems, cable modems and Ethernet cards.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method, performed on a computer system, for determining a localized measure of regional pattern density in a fabrication process of a chip, the method comprising:
    using the computer system to perform the following:
        determining pattern density values for each cell of a plurality of cells of interest;
        averaging the pattern density values for each cell within a first selected region about and including a target cell to determine the localized measure of regional pattern density for the target cell, wherein the averaging includes using pattern density values from a diametrically opposite side of the chin to complete the first selected region when the first selected region about a target cell extends beyond a border of the chip;
        storing the localized measure of regional pattern density for the target cell; and
        repeating the averaging and the storing for each of the plurality of cells.

2. The method of claim 1, wherein the average includes a weighted average.

3. The method of claim 1, further comprising repeating the averaging and the storing for a second selected region including a plurality of the first selected regions.

4. A system for determining a localized measure of regional pattern density in a fabrication process of a chip, the system comprising:
    a density determinator for determining pattern density values for each cell of a plurality of cells of interest;
    an averager for averaging the pattern density values for each cell within a first selected region about and including a target cell to determine the localized measure of regional pattern density for the target cell, wherein the averager uses the pattern density values from a diametrically opposite side of the chin to complete the first selected region when the first selected region about a target cell extends beyond a border of the chip;
    a storer for storing the localized measure of regional pattern density for the target cell; and
    a repeater for repeating the averaging and the storing for each of the plurality of cells.

5. The system of claim 4, wherein the average includes a weighted average.

6. The system of claim 4, wherein the repeater employs the averager and the storer to determine a local measure of regional pattern density for a second selected region based on a plurality of the first selected regions.

* * * * *